United States Patent
Lo et al.

(10) Patent No.: US 10,161,041 B2
(45) Date of Patent: Dec. 25, 2018

(54) THERMAL CHEMICAL VAPOR DEPOSITION SYSTEM AND OPERATING METHOD THEREOF

(71) Applicant: TAIWAN SEMICONDUCTOR MANUFACTURING CO., LTD., Hsinchu (TW)

(72) Inventors: Yen-Chan Lo, Hsinchu (TW); Yi-Fang Lai, Hsinchu County (TW); Po-Hsiung Leu, Taoyuan (TW); Ding-I Liu, Hsinchu (TW); Si-Wen Liao, Hsinchu (TW); Kai-Shiung Hsu, Hsinchu (TW); Jheng-Uei Hsieh, Hsinchu County (TW); Shian-Huei Lin, Miaoli County (TW); Jui-Fu Hsu, Hsinchu (TW); Cheng-Tsung Wu, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/221,506

(22) Filed: Jul. 27, 2016

(65) Prior Publication Data
US 2017/0107619 A1     Apr. 20, 2017

Related U.S. Application Data

(60) Provisional application No. 62/241,629, filed on Oct. 14, 2015.

(51) Int. Cl.
*C23C 16/46* (2006.01)
*C23C 16/458* (2006.01)

(52) U.S. Cl.
CPC ............ *C23C 16/46* (2013.01); *C23C 16/458* (2013.01)

(58) Field of Classification Search
CPC .................................................. C23C 16/4404
See application file for complete search history.

(56) References Cited

U.S. PATENT DOCUMENTS

| | | |
|---|---|---|
| 2005/0217799 A1 | 10/2005 | O'Meara et al. |
| 2005/0263719 A1 | 12/2005 | Ohdaira et al. |
| 2008/0241379 A1 | 10/2008 | Suzuki et al. |
| 2010/0314356 A1* | 12/2010 | Nagayama .......... C23C 16/0227 216/52 |
| 2013/0047916 A1 | 2/2013 | Nishibayashi et al. |
| 2014/0287142 A1 | 9/2014 | Boyd et al. |

FOREIGN PATENT DOCUMENTS

| | | |
|---|---|---|
| KR | 1020070114441 A | 12/2007 |
| KR | 1020130024816 A | 3/2013 |
| TW | 200539268 A | 12/2005 |
| TW | I305656 B | 1/2009 |
| TW | 201329281 A | 7/2013 |
| TW | 201410907 A | 3/2014 |

* cited by examiner

*Primary Examiner* — Joseph A Miller, Jr.
(74) *Attorney, Agent, or Firm* — Slater Matsil, LLP (57) ABSTRACT

A thermal chemical vapor deposition (CVD) system includes a bottom chamber, an upper chamber, a workpiece support, a heater and at least one shielding plate. The upper chamber is present over the bottom chamber. The upper chamber and the bottom chamber define a chamber space therebetween. The workpiece support is configured to support a workpiece in the chamber space. The heater is configured to apply heat to the workpiece. The shielding plate is configured to at least partially shield the bottom chamber from the heat.

18 Claims, 4 Drawing Sheets

THERMAL CHEMICAL VAPOR DEPOSITION SYSTEM AND OPERATING METHOD THEREOF

PRIORITY CLAIM AND CROSS-REFERENCE

This application claims priority to U.S. Provisional Application Ser. No. 62/241,629, filed Oct. 14, 2015, which is herein incorporated by reference.

BACKGROUND

Chemical vapor deposition (CVD) is a chemical process adopted in the semiconductor manufacturing industry to produce films. In general, a wafer is exposed to one or more volatile precursors, which react and/or decompose on the wafer to produce the film of deposit. In practice, the uniformity of the film affects the quality of the film deposition.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, operations, operations, elements, and/or components, but do not preclude the presence or addition of one or more other features, regions, integers, operations, operations, elements, components, and/or groups thereof.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 1:
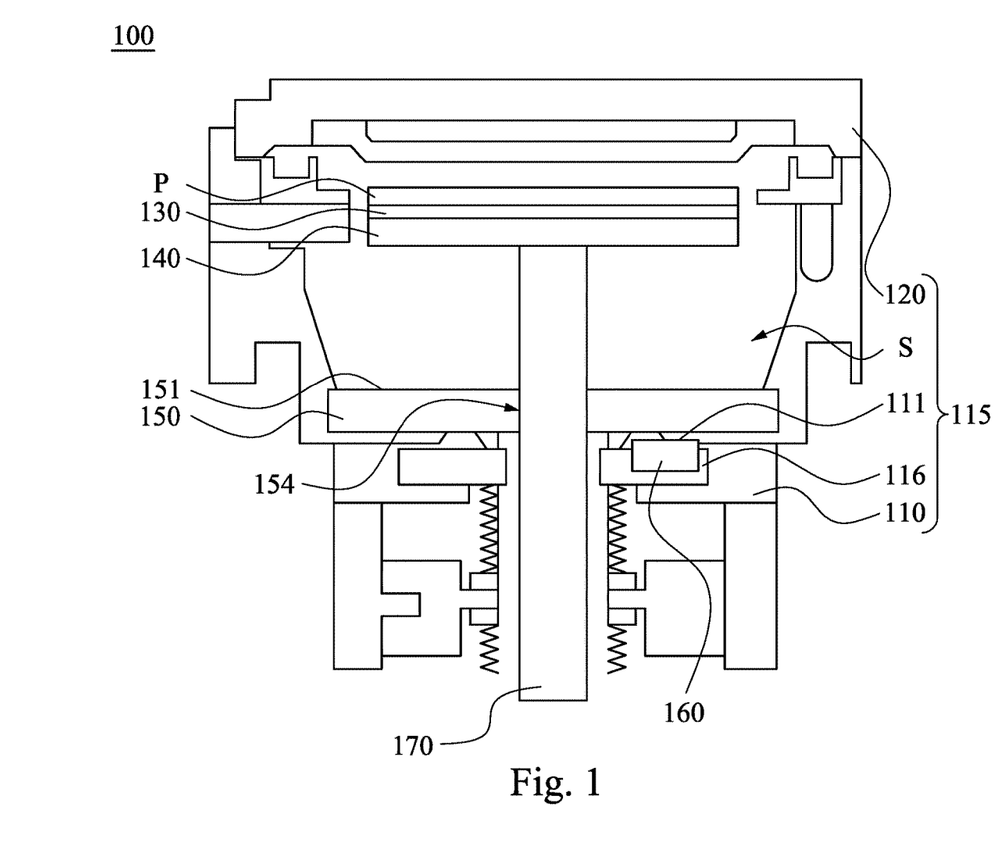
FIG. 1 is a schematic view of a thermal chemical vapor deposition (CVD) system in accordance with some embodiments of the present disclosure.

Reference is made to FIG. 1. FIG. 1 is a schematic view of a thermal chemical vapor deposition (CVD) system 100 in accordance with some embodiments of the present disclosure. As shown in FIG. 1, the thermal chemical vapor deposition system 100 includes a bottom chamber 110, an upper chamber 120, a workpiece support 130, a heater 140 and at least one shielding plate 150. The upper chamber 120 is present over the bottom chamber 110. The upper chamber 120 and the bottom chamber 110 form a processing chamber 115 and define a chamber space S therebetween. The workpiece support 130 is configured to support a workpiece P in the chamber space S of the processing chamber 115. The heater 140 is configured to apply heat to the workpiece P. The shielding plate 150 is configured to at least partially shield the bottom chamber 110 from the heat.

To be more specific, the bottom chamber 110 has an upper surface 111 facing to the chamber space S. In details, the processing chamber 115 has a bottom wall 116 and the upper surface 111 is located on the bottom wall 116. Furthermore, the upper surface 111 has an asymmetric reflectance against the heat. In some embodiments, the thermal chemical vapor deposition system 100 further includes at least one mechanical part 160. The mechanical part 160 is present on the bottom chamber 110. A combination of the mechanical part 160 and the bottom chamber 110 has the upper surface 111 facing to the chamber space S. The presence of the mechanical part 160 on the bottom chamber 110 leads to the asymmetric reflectance against the heat of the upper surface 111.

As shown in FIG. 1, the heater 140 is disposed between the workpiece support 130 and the shielding plate 150. In some embodiments, the shielding plate 150 at least partially overlaps the upper surface 111 of the bottom chamber 110. To be more specific, the shielding plate 150 at least partially overlaps the mechanical part 160. In some embodiments, the shielding plate 150 is a reflector and has a reflecting surface 151 facing to the workpiece support 130, and the reflecting surface 151 has a reflectance against the heat. The shielding plate 150 as the reflector is present between the heater 140 and the bottom wall 116 of the processing chamber 115. During the operation of the thermal chemical vapor deposition system 100, the heat emitted from the heater 140 away from the workpiece P will be reflected towards the workpiece P. In this way, the heat emitted from the heater 140 away from the workpiece P can be reflected towards the workpiece P by the reflecting surface 151 of the shielding plate 150 in an even manner, facilitating an even temperature distribution of the workpiece P and thus the chamber space S in which the workpiece P is disposed. Therefore, with an even temperature distribution of the workpiece P and the chamber space S, the performance of the thermal chemical vapor deposition system 100 is improved.

Technically speaking, for the reflecting surface 151 of the shielding plate 150 to have one reflectance against the heat, the reflecting surface 151 of the shielding plate 150 is polished to a certain degree, namely the first level of polishing. In other words, the reflecting surface 151 of the shielding plate 150 is polished to have the first level of polishing. With the first level of polishing, the heat emitted from the heater 140 away from the workpiece P can be reflected towards the workpiece P in an even manner.

Figures 2, 3:
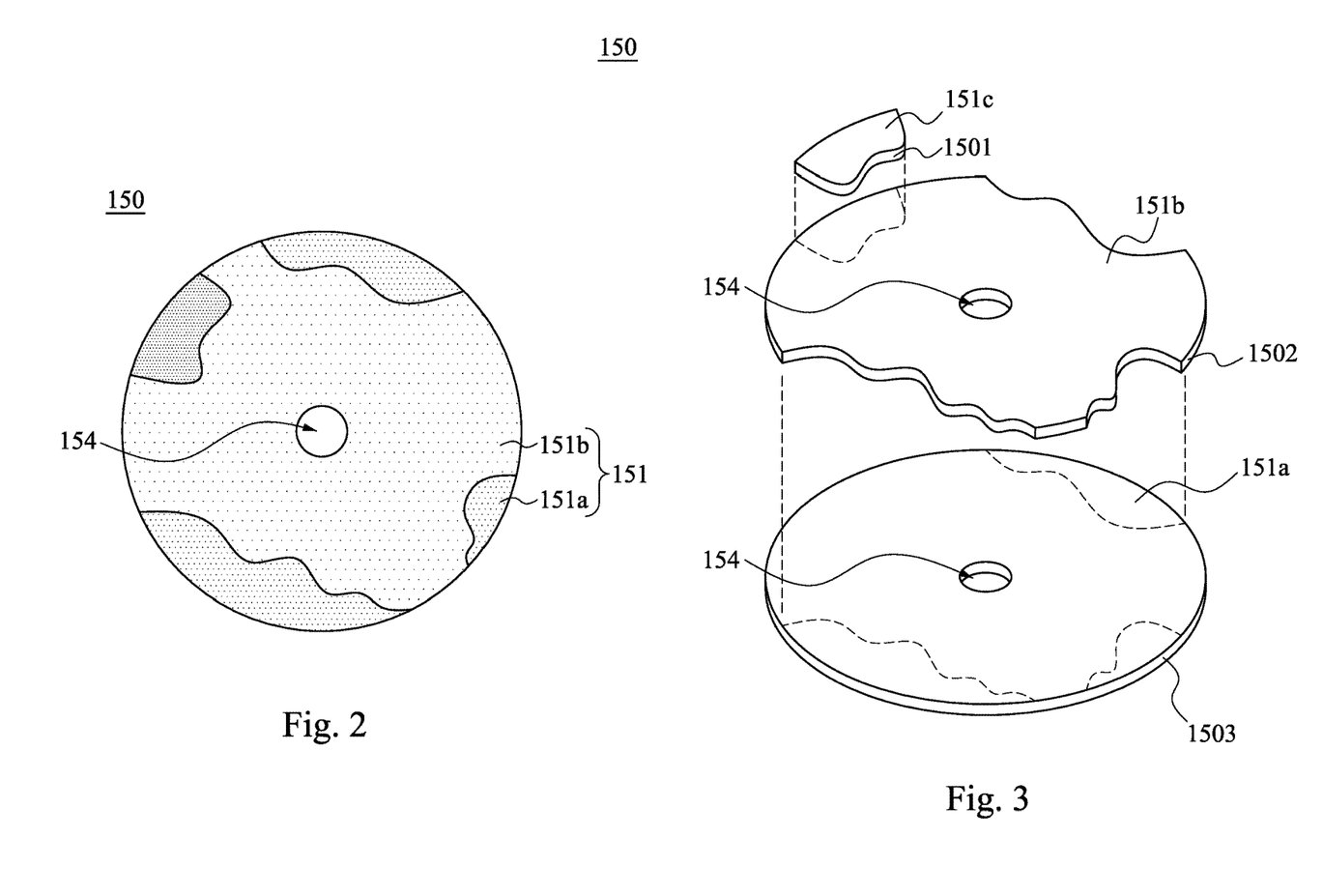
FIG. 2 is a plan view of a shielding plate in accordance with some other embodiments of the present disclosure.
FIG. 3 is an explored view of a shielding plate in accordance with some other embodiments of the present disclosure.

Reference is made to FIG. 2. FIG. 2 is a plan view of a shielding plate 150 in accordance with some other embodiments of the present disclosure. In some embodiments, the reflecting surface 151 of the shielding plate 150 has at least two reflecting regions. For example, as shown in FIG. 2, the reflecting surface 151 of the shielding plate 150 has at least one first reflecting region 151a and at least one second reflecting region 151b. The first reflecting region 151a and the second reflecting region 151b have different reflectances against the heat.

In some other embodiments, the reflecting surface 151 of the shielding plate 150 can be formed by the lamination of plates with respectively different sizes and different reflectances, such that a third reflecting region, a fourth reflecting region, and a fifth reflecting region etc. are exposed according to actual situations.

On the other hand, as mentioned above, the reflecting surface 151 has at least two reflecting regions, or a plurality of reflecting regions, such as the first reflecting region 151a and the second reflecting region 151b for instance. Each of the reflecting regions has a reflectance against the heat. In some embodiments, the reflectance against the heat of each of the reflecting regions is determined by the level of polishing of the corresponding reflecting region. As mentioned above, the first reflecting region 151a has the first level of polishing. Similarly, the second reflecting region 151b has a second level of polishing. This means the first reflecting region 151a has a reflectance corresponding to the first level of polishing, while the second reflecting region 151b has a reflectance corresponding to the second level of polishing. Practically speaking, the second level of polishing is different from the first level of polishing.

In addition, in some embodiments, the level of polishing of each of the reflecting regions is determined by the degree of roughness of the corresponding reflecting region. In other words, the roughness of each of the reflecting regions determines the amount of the heat from the heater 140 to be reflected towards the workpiece P by the corresponding reflecting region. In some embodiments, the reflecting regions have different roughnesses. In other words, at least two of the roughnesses are different. This means, the roughnesses of at least two of the reflecting regions are different, such that at least two of the reflectances against the heat are different. To be more specific, as mentioned above, the first reflecting region 151a has the first level of polishing while the second reflecting region 151b has the second level of polishing, where the second level of polishing is different from the first level of polishing.

Furthermore, in practical applications, the allocation of the reflecting regions on the reflecting surface 151 of the shielding plate 150 can be determined according to the actual situations. For instance, if it is detected that a portion of the workpiece P has a lower temperature than the other portion of the workpiece P, the reflecting surface 151 can be designed such that the reflecting region with a higher reflectance, such as the reflecting region 151a, is located corresponding to the portion of the workpiece P with the lower temperature. In this way, more amount of heat from the heater 140 can be reflected towards the portion of the workpiece P with the lower temperature. Meanwhile, the reflecting region with a lower reflectance, such as the reflecting region 151b, is located corresponding to the other portion of the workpiece P with the higher temperature. In this way, less amount of heat from the heater 140 can be reflected towards the portion of the workpiece P with the higher temperature. As a result, the temperature difference between the portion of the workpiece P with the lower temperature and the other portion of the workpiece P with the relatively higher temperature is reduced. Thus, an even temperature distribution of the workpiece P and thus the chamber space S in which the workpiece P is disposed can be facilitated. Consequently, with an even temperature distribution of the workpiece P and the chamber space S, the performance of the thermal chemical vapor deposition system 100 is improved.

For the sake of clarity, it is assumed that the first level of polishing corresponds to a higher reflectance while the second level of polishing corresponds to a relatively lower reflectance. If it is detected that a portion of the workpiece P has a lower temperature than the other portion of the workpiece P, the reflecting surface 151 can be designed such that the first reflecting region 151a is located corresponding to the portion of the workpiece P with the lower temperature. On the contrary, the second reflecting region 151b is located corresponding to the portion of the workpiece P with the relatively higher temperature. As a result, the temperature difference between the portion of the workpiece P with the lower temperature and the other portion of the workpiece P with the relatively higher temperature is reduced. Thus, an even temperature distribution of the workpiece P and thus the chamber space S in which the workpiece P is disposed can be facilitated. Consequently, with an even temperature distribution of the workpiece P and the chamber space S, the performance of the thermal chemical vapor deposition system 100 is improved.

In some embodiments, the reflectance against the heat of each of the reflecting regions is determined by the nature of the material of the corresponding reflecting region. To be more specific, each of the reflecting regions includes a material, which determines the reflectance against the heat of the corresponding reflecting region. In some embodiments, the reflecting regions as the sub-reflectors are made of different materials. In other words, at least two of the materials are different, such that at least two of the reflectances against the heat are different. To be more specific, the first reflecting region 151a and the second reflecting region 151b include different materials, such that the reflectance against the heat of the first reflecting region 151a is different from the reflectance against the heat of the second reflecting region 151b.

Again, as mentioned above, the allocation of the reflecting regions on the reflecting surface 151 can be determined according to the actual situations. For the sake of clarity, it is assumed that the material included by the first reflecting region 151a corresponds to a higher reflectance against the heat while the material included by the second region 151b corresponds to a relatively lower reflectance against the heat. If it is detected that a portion of the workpiece P has a lower temperature than the other portion of the workpiece P, the reflecting surface 151 can be designed such that the first reflecting region 151a is located corresponding to the portion of the workpiece P with the lower temperature. On the contrary, the second reflecting region 151b is located corresponding to the portion of the workpiece P with the relatively higher temperature. As a result, the temperature difference between the portion of the workpiece P with the lower temperature and the other portion of the workpiece P with the relatively higher temperature is reduced. Thus, an even temperature distribution of the workpiece P and thus the chamber space S in which the workpiece P is disposed can be facilitated. Consequently, with an even temperature distribution of the workpiece P and the chamber space S, the performance of the thermal chemical vapor deposition system 100 is improved.

In some embodiments, the material included by the first reflecting regions 151a can be a metal. On the contrary, the material included by the second reflecting regions 151b can be ceramic. Relatively speaking, the metal has a higher reflectance against the heat than ceramic. This means more amount of heat will be reflected towards the workpiece P by metal, and relatively less amount of heat will be reflected towards the workpiece P by ceramic. To be more specific, in some other embodiments, the material to be included by the reflecting regions of the reflecting surface 151 can be, for instance, aluminum, aluminum alloy, ceramic such as aluminum oxide ($Al_2O_3$), silicon carbide (SiC), quartz, carbon coated with silicon carbide or polytetrafluoroethene (Teflon) etc. On the other hand, with regards to the different materials to be included by the reflecting regions of the reflecting surface 151, different procedures of surface treatments are correspondingly employed, such as coating, blasting, cutting and/or approaches for achieving different levels of roughness. Furthermore, in case of surface treatments, chemical coating of nickel, anodic treatment such as coating of aluminum oxide, coating of yttrium oxide ($Y_2O_3$), coating of yttrium fluoride ($YF_3$), coating of silicon carbide, coating of polytetrafluoroethene and various types of coating can be employed according to the actual conditions.

Reference is made to FIG. 3. FIG. 3 is an explored view of a shielding plate 150 in accordance with some other embodiments of the present disclosure. In practical applications, unlike the shielding plate 150 as a single piece as shown in FIG. 2, the shielding plate 150 can be formed by the lamination of a plurality of subsidiary plates. For example, as shown in FIG. 3, the shielding plate 150 is formed by a subsidiary plate 1501, a subsidiary plate 1502 and a subsidiary plate 1503. The subsidiary plate 1501, the subsidiary plate 1502 and the subsidiary plate 1503 have different reflectances from each other. Furthermore, the subsidiary plate 1501 has a smaller surface than that of the subsidiary plate 1502, while the subsidiary plate 1502 has a smaller surface than that of the subsidiary plate 1503. When the subsidiary plate 1501 is laminated on the subsidiary plate 1502, the portion of the subsidiary plate 1502 not overlapped by the subsidiary plate 1501 is exposed to be the second reflecting region 151b. In addition, when the subsidiary plate 1502 is laminated on the subsidiary plate 1503, the portion of the subsidiary plate 1503 not overlapped by the subsidiary plate 1502 is exposed to be the second reflecting region 151a. Moreover, the surface of the subsidiary plate 1501 can be the third reflecting region 151c.

Figure 4:
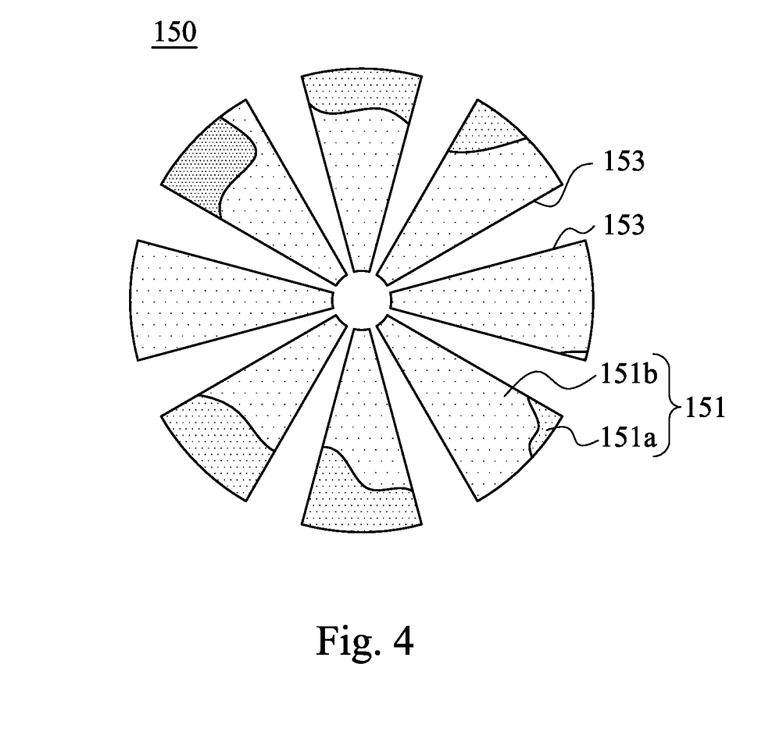
FIGS. 4-6 are plan views of a shielding plate in accordance with some other embodiments of the present disclosure.

Reference is made to FIG. 4. FIG. 4 is a plan view of a shielding plate 150 in accordance with some other embodiments of the present disclosure. In some embodiments, the shielding plate 150 includes a plurality of reflecting sections 153. The reflecting sections 153 are the sub-reflectors. The reflecting sections 153 as the sub-reflectors are detachably connected to each other. In practice, at least one of the reflecting sections 153 is in a shape of a sector, a polygon, a ring section, or combinations thereof. Moreover, the allocation of the reflecting sections 153 is independent of the allocation of the reflecting regions. This means at least one reflecting region can be allocated on each piece of the reflecting sections 153. In other words, as least one reflecting section 153 as the sub-reflector has the first reflecting region 151a and the second reflecting region 151b. As shown in FIG. 4, the reflecting sections 153 in the shapes of sectors are detached from each other.

During the operation of the thermal chemical vapor deposition system 100, the reflecting sections 153 are detachably connected to form the reflecting surface 151 with different reflecting regions. In this way, every single piece of the reflecting sections 153 can be replaced according to the actual situations. For instance, if it is detected that a portion of the workpiece P has a lower temperature than the other portion of the workpiece P, the reflecting section 153 located corresponding to the portion of the workpiece P with the lower temperature can be replaced for the reflecting section 153 with a reflecting region of a higher reflectance against the heat, such that more amount of heat from the heater 140 will be reflected towards the portion of the workpiece P with the lower temperature. On the contrary, if it is detected that a portion of the workpiece P has a higher temperature than the other portion of the workpiece P, the reflecting section 153 located corresponding to the portion of the workpiece P with the higher temperature can be replaced for the reflecting section 153 with a reflecting region of a lower reflectance against the heat, such that less amount of heat from the heater 140 will be reflected towards the portion of the workpiece P with the higher temperature. Thus, an even temperature distribution of the workpiece P and thus the chamber space S in which the workpiece P is disposed can be facilitated. Consequently, with an even temperature distribution of the workpiece P and the chamber space S, the performance of the thermal chemical vapor deposition system 100 is improved.

Since the reflectance against the heat of the shielding plate 150 can be simply adjusted by replacing any of the reflecting sections 153 with an appropriate reflectance against the heat according to the actual situations, the temperature distribution of the workpiece P and thus the chamber space S can be conveniently controlled. As a result, with an even temperature distribution of the workpiece P and the chamber space S, the performance of the thermal chemical vapor deposition system 100 is improved in a simple and convenient manner.

Furthermore, in case it is detected that there is an uneven temperature distribution of the workpiece P, instead of replacing the shielding plate 150 as a whole, replacement of the relevant reflecting sections 153 can already help to achieve the even temperature distribution of the workpiece P and thus the chamber space S in which the workpiece P is disposed. Therefore, the time and cost involved for the adjustment of the reflectance against the heat of the shielding plate 150 is effectively reduced. In other words, the efficiency of the thermal chemical vapor deposition system 100 is correspondingly increased.

For instance, in some embodiments, at least one of the reflecting sections 153 has the first reflecting region 151a while at least another one of the reflecting sections 153 has the second reflecting region 151b. In this way, the reflecting surface 151 of the shielding plate 150 has both the first reflecting region 151a and the second reflecting region 151b. This means, in case it is detected that there is an uneven temperature distribution of the workpiece P, the relevant reflecting sections 153 can be replaced appropriately as mentioned above in order to achieve the even temperature distribution of the workpiece P and thus the chamber space S in which the workpiece P is disposed.

In some embodiments, as shown in FIG. 4, at least one of the reflecting sections 153 has both the first reflecting region 151a and the second reflecting region 151b according to the actual situations. In this way, the allocation of the first reflecting regions 151a and the second reflecting regions 151b on the reflecting surface 151 of the shielding plate 150 can be more flexible, fulfilling the actual situations in a more precise manner.

Figure 5:
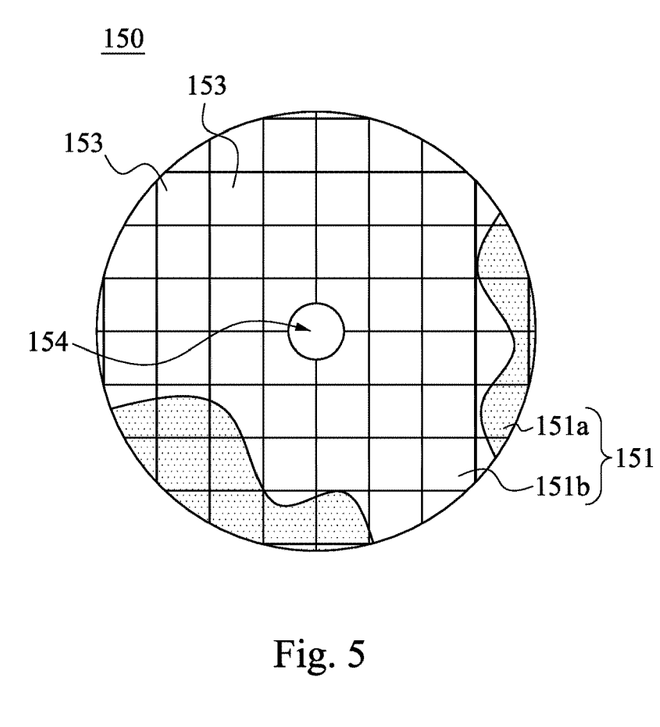

Reference is made to FIG. 5. FIG. 5 is a plan view of a shielding plate 150 in accordance with some other embodiments of the present disclosure. As shown in FIG. 5, again, the shielding plate 150 includes a plurality of reflecting sections 153. According to actual situations, each of the reflecting sections 153 can be in a shape of a polygon. Similarly, during the operation of the thermal chemical vapor deposition system 100, the reflecting sections 153 are detachably connected to form the reflecting surface 151 of the shielding plate 150 with different reflecting regions.

Similarly as mentioned above, the reflecting regions include the first reflecting region 151a and the second reflecting region 151b, in which the first reflecting region 151a has the first level of polishing while the second reflecting region 151b has the second level of polishing. Each of the reflecting sections 153 in the shape of a polygon can have at least one first reflecting region 151a and/or at least one second reflecting region 151b. In this way, the allocation of the first reflecting regions 151a and the second reflecting regions 151b on the reflecting surface 151 of the shielding plate 150 can be more flexible, fulfilling the actual situations in a more precise manner.

Figure 6:
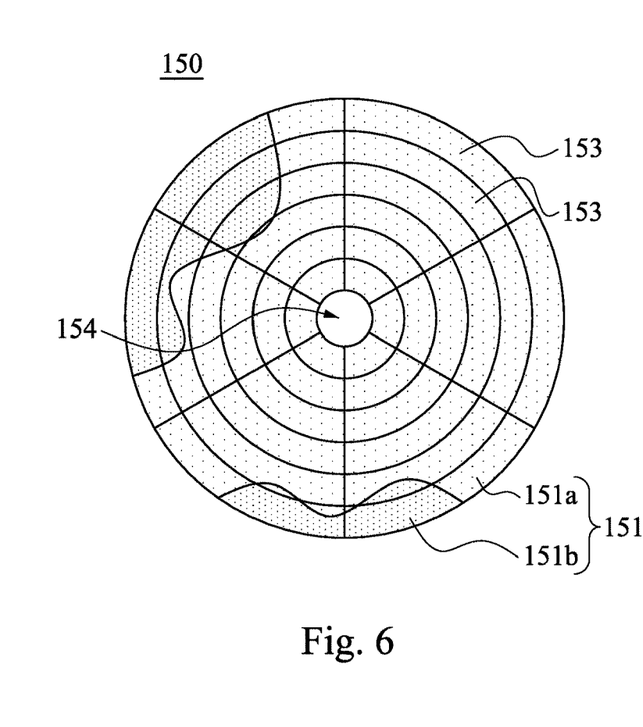

Reference is made to FIG. 6. FIG. 6 is a plan view of a shielding plate 150 in accordance with some other embodiments of the present disclosure. As shown in FIG. 6, again, the shielding plate 150 includes a plurality of reflecting sections 153. According to actual situations, each of the reflecting sections 153 can be in a shape of a ring section. Similarly, during the operation of the thermal chemical vapor deposition system 100, the reflecting sections 153 are detachably connected to form the reflecting surface 151 of the shielding plate 150 with different reflecting regions.

Similarly as mentioned above, the reflecting regions include the first reflecting region 151a and the second reflecting region 151b, in which the first reflecting region 151a has the first level of polishing while the second reflecting region 151b has the second level of polishing. Each of the reflecting sections 153 in the shape of a ring section can have at least one first reflecting region 151a and/or at least one second reflecting region 151b. In this way, the allocation of the first reflecting regions 151a and the second reflecting regions 151b on the reflecting surface 151 of the shielding plate 150 can be more flexible, fulfilling the actual situations in a more precise manner.

Structurally speaking, as shown in FIGS. 1-3, 5-6, the shielding plate 150 has an opening 154 therein. As shown in FIG. 1, the thermal chemical vapor deposition system 100 further includes at least one lift pin 170. The lift pin 170 is connected to the workpiece support 130 at least through the opening 154 of the shielding plate 150, and also the bottom wall 116. Thus, the workpiece support 130 can be located between the workpiece P and the shielding plate 150.

Practically speaking, the chemical vapor deposition is a chemical process adopted in the semiconductor manufacturing industry to produce films. In general, a substrate is exposed to one or more volatile precursors, which react and/or decompose on the substrate to produce the film of deposit. In some embodiments, the workpiece P as mentioned above is the substrate. With reference to the thermal chemical vapor deposition system 100 as mentioned above, the embodiments of the present disclosure further provide a method for processing the substrate. The method includes the following steps (it is appreciated that the sequence of the steps and the sub-steps as mentioned below, unless otherwise specified, all can be adjusted according to the actual situations, or even executed at the same time or partially at the same time):

(1) applying heat to the substrate in the processing chamber 115, while at least a part of the heat transferring towards the bottom wall 116 of the processing chamber 115.

(2) at least partially shielding the bottom wall 116 of the processing chamber 115 from said part of the heat transferring towards the bottom wall 116 of the processing chamber 115.

To be more specific, during the operation of the thermal chemical vapor deposition system 100, at least a part of the heat from the heater 140 is transferred towards the bottom wall 116 of the processing chamber 115. However, since the bottom wall 116 of the processing chamber 115 is at least partially shielded, the bottom wall 116 of the processing chamber 115 does not receive the heat from the heater 140. Thus, the bottom wall 116 of the processing chamber 115 does not reflect the heat from the heater 140.

In addition that the bottom wall 116 of the processing chamber 115 does not receive the heat from the heater 140, the step (2) of at least partially shielding the bottom wall 116 of the processing chamber 115 further includes the following sub-step:

(2.1) at least partially reflecting said part of the heat transferring towards the bottom wall 116 of the processing chamber 115.

To be more specific, the part of the heat from the heater 140 towards the bottom wall 116 of the processing chamber 115 is reflected towards the substrate instead of reaching the bottom wall 116 of the processing chamber 115. Thus, the temperature in the processing chamber 115 and thus the efficiency of the operation of the thermal chemical vapor deposition system 100 is maintained. Furthermore, in order to facilitating an even temperature distribution of the substrate and an even temperature distribution of processing chamber 115 in which the substrate is disposed, the said part of the heat transferring towards the bottom wall 116 of the processing chamber 115 is at least partially reflected by the nonuniformly reflecting surface 151.

Since the nonuniformly reflecting surface 151 reflects the heat nonuniformly, the nonuniformity can be adjusted according to the actual situation such that, as mentioned above, the heat reflected to the substrate can lead to an even temperature distribution of the substrate and thus an even temperature distribution of processing chamber 115 in which the substrate is disposed. Therefore, with an even temperature distribution of the substrate and an even temperature distribution of processing chamber 115, the performance of the thermal chemical vapor deposition system 100 is improved.

According to various embodiments of the present disclosure, during the operation of the thermal chemical vapor deposition system, the heat emitted from the heater away from the workpiece will be reflected towards the workpiece. In this way, the heat emitted from the heater away from the workpiece can be reflected towards the workpiece by the reflecting surface of the shielding plate in an even manner, facilitating an even temperature distribution of the workpiece and thus the chamber space in which the workpiece is disposed. Therefore, with an even temperature distribution of the workpiece and the chamber space, the performance of the thermal chemical vapor deposition system is improved.

According to various embodiments of the present disclosure, the thermal chemical vapor deposition system includes the bottom chamber, the upper chamber, the workpiece support, the heater and at least one shielding plate. The upper chamber is present over the bottom chamber, in which the upper chamber and the bottom chamber define the chamber space therebetween. The workpiece support is configured to support the workpiece in the chamber space. The heater is configured to apply heat to the workpiece. The shielding plate is configured to at least partially shield the bottom chamber from the heat.

According to various embodiments of the present disclosure, the thermal chemical vapor deposition system includes the processing chamber, the workpiece support, the heater and at least one reflector. The processing chamber has the bottom wall. The workpiece support is configured to support the workpiece in the processing chamber. The heater is configured to apply heat to the workpiece. The reflector is present between the heater and the bottom wall of the processing chamber. The reflector has the reflecting surface facing to the workpiece, in which the reflecting surface has at least one reflectance against the heat.

According to various embodiments of the present disclosure, the method for operating the thermal chemical vapor deposition system includes applying heat to the workpiece in the processing chamber, while at least a part of the heat transferring towards the bottom wall of the processing chamber, and at least partially shielding the bottom wall of the processing chamber from said part of the heat transferring towards the bottom wall of the processing chamber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A thermal chemical vapor deposition (CVD) system, comprising:
   a bottom chamber wall;
   an upper chamber wall present over the bottom chamber wall, wherein the upper chamber wall and the bottom chamber wall define a chamber space therebetween;
   a workpiece support configured to support a workpiece in the chamber space;
   a heater configured to apply heat to the workpiece; and
   at least one shielding plate configured to at least partially shield the bottom chamber wall from the heat, and wherein the at least one shielding plate has a reflecting surface facing the workpiece support, the reflecting surface has at least two reflecting regions, and the reflecting regions have different roughnesses or are made of different materials.

2. The thermal CVD system of claim 1, wherein the bottom chamber wall has an upper surface facing to the chamber space, and the upper surface has an asymmetric reflectance against the heat.

3. The thermal CVD system of claim 2, wherein the shielding plate at least partially overlaps the upper surface of the bottom chamber wall.

4. The thermal CVD system of claim 1, further comprising:
   at least one mechanical part present on the bottom chamber wall, wherein a combination of the mechanical part and the bottom chamber wall has an upper surface facing to the chamber space, and the upper surface has an asymmetric reflectance against the heat.

5. The thermal CVD system of claim 4, wherein the shielding plate at least partially overlaps the mechanical part.

6. The thermal CVD system of claim 1, wherein the shielding plate has a reflecting surface facing to the workpiece support, and the reflecting surface has a reflectance against the heat.

7. The thermal CVD system of claim 1, wherein the shielding plate has a reflecting surface facing to the workpiece support, the reflecting surface has at least two reflecting regions, and the reflecting regions have different reflectances against the heat.

8. The thermal CVD system of claim 1, wherein the shielding plate comprises a plurality of reflecting sections detachably connected to each other.

9. The thermal CVD system of claim 8, wherein at least one of the reflecting sections is in a shape of a sector, a polygon, a ring section, or combinations thereof.

10. The thermal CVD system of claim 1, wherein the shielding plate has an opening therein; and
    further comprising:
    at least one lift pin connected to the workpiece support at least through the opening of the shielding plate.

11. A thermal chemical vapor deposition (CVD) system, comprising:
    a processing chamber having a bottom wall;
    a workpiece support configured to support a workpiece in the processing chamber;
    a heater configured to apply heat to the workpiece; and
    at least one reflector present between the heater and the bottom wall of the processing chamber, the reflector having a reflecting surface facing to the workpiece, wherein the reflecting surface has a first reflecting region having a first reflectance against the heat and at least one second reflecting region having a second reflectance against the heat that is different than the first reflectance.

12. The thermal CVD system of claim 11, wherein the first reflecting region has a first level of polishing and the at least one second reflecting region has a second level of polishing different from the first level of polishing.

13. The thermal chemical vapor deposition system of claim 12, wherein the reflector comprises a plurality of sub-reflectors detachably connected to each other, and at least one of the sub-reflectors has the first reflecting region and the second reflecting region.

14. The thermal chemical vapor deposition system of claim 11, wherein the reflector comprises at least two sub-reflectors detachably connected to each other, and the sub-reflectors are made of different materials.

15. The thermal chemical vapor deposition system of claim 11, further comprising:
   at least one lift pin connected to the workpiece support at least through the bottom wall.

16. A thermal chemical vapor deposition (CVD) system, comprising:
   a chamber space;
   a workpiece support configured to support a workpiece in the chamber space;
   a heater configured to apply heat to the workpiece; and
   at least one shielding plate configured to at least partially shield a bottom portion of the chamber space from the heat, wherein the at least one shielding plate includes at least two regions having different levels of heat reflectance relative one another, and wherein the different levels of heat reflectance result from a property selected from the group consisting of different materials and different roughness.

17. The CVD system of claim 16, wherein the at least one shielding plate is a reflector present between the heater and a bottom wall of the chamber space.

18. The CVD system of claim 16, wherein the at least two regions are detachably connected to each other.

* * * * *